United States Patent [19]

Otaka

[11] Patent Number: 4,916,315
[45] Date of Patent: Apr. 10, 1990

[54] SCANNING ELECTRON MICROSCOPE FOR OBSERVING AND MEASURING MINUTE PATTERN OF SAMPLE

[75] Inventor: Tadashi Otaka, Katsuta, Japan

[73] Assignee: Hitachi, Ltd., Tokyo, Japan

[21] Appl. No.: 330,766

[22] Filed: Mar. 30, 1989

[30] Foreign Application Priority Data

Apr. 1, 1988 [JP] Japan .................................. 63-78149

[51] Int. Cl.⁴ .............................................. H01J 37/28
[52] U.S. Cl. ...................................... 250/310; 250/311
[58] Field of Search ................................ 250/310, 311

[56] References Cited

U.S. PATENT DOCUMENTS

| | | | |
|---|---|---|---|
| 4,426,577 | 1/1984 | Koike et al. | 250/310 |
| 4,437,009 | 3/1984 | Yamazaki | 250/310 |
| 4,670,652 | 6/1987 | Ichihashi et al. | 250/310 |
| 4,751,384 | 6/1988 | Murakoshi et al. | 250/310 |
| 4,757,926 | 8/1988 | Murakoshi et al. | 250/310 |
| 4,818,874 | 4/1989 | Ishikawa | 250/310 |

Primary Examiner—Janice A. Howell
Assistant Examiner—Kiet T. Nguyen
Attorney, Agent, or Firm—Antonelli, Terry & Wands

[57] ABSTRACT

A scanning electron microscope for observing and measuring a minute pattern of a sample comprising an electron lens for focusing an electron beam from an electron source onto the sample, wherein the electron beam scans on the sample, an inclining means for inclining the sample at an arbitrary angle α, and two secondary electron detectors are disposed at the position which are respectively turned at the same angle θ around the central axis of the electron beam from a plane which contains an axis of inclination of the sample and a central axis of the electron beam. As it is possible to measure the length of the minute pattern by detecting the secondary electron having a symmetrical wave-form while observing the minute pattern at the arbitrary angle, high measuring accuracy is attained.

5 Claims, 3 Drawing Sheets

SCANNING ELECTRON MICROSCOPE FOR OBSERVING AND MEASURING MINUTE PATTERN OF SAMPLE

BACKGROUND OF THE INVENTION

The present invention relates to scanning electron microscope which is suitable for observing a minute pattern of the sample and at the same time measuring the length of the minute pattern of the sample such as semiconductor device.

In the general apparatus of the scanning electron microscope, the sample is not inclined and an electron beam irradiated from an electron source to the sample is inclined in a previously determined angle in order to observe the sample. When measuring the minute pattern of the sample, the electron beam is perpendicularly irradiated from the electron source which is disposed in vertical direction over the sample. Because, when the electron beam is inclined, the wave-form of secondary electron signal detected by the detector becomes non-symmetrical, and it becomes difficult to accurately measure the length of the pattern of the sample. Therefore, when measuring, the electron beam is perpendicularly irradiated. U.S. Pat. Nos. 4,670,652, 4,767,926, 4,751,384 are cited as examples of such device. In these conventional system, there arise following drawbacks.

When observing the sample, sometimes the electron beam is needed to be inclined, and when measuring the portion of the sample which is needed to be observed in some inclined angle, the sample is perpendicularly irradiated by moving the irradiation angle of the electron beam. And, the portion which is needed to be observed does not correspond to the portion which is needed to be measured, because the electron beam is irradiated with different angle in observing from that in measuring. Therefore, it is difficult to measure the portion of the sample which is needed to be observed with high accuracy.

SUMMARY OF THE INVENTION

The present invention has been accomplished to overcome the above mentioned problem of the conventional apparatus.

An object of present invention is to provide a scanning electron microscope which makes it possible to measure the length of the portion of the sample in high accuracy while observing the portion of the sample by inclining the sample in arbitrary angle thereof.

Another object of the present invention is to provide a scanning electron microscope having two secondary electron detectors which makes it possible to detect a symmetrical wave-form of the secondary electron signal generated from the portion of the sample without losing high efficiency of detection of the detectors even when the sample is inclined at a large angle.

In order to obtain above objects, the present invention has an inclining means for inclining the sample disposed under the objective lens of the scanning electron microscope in arbitrary angles, and two detectors which are disposed at the positions which are respectively turned at the same rotational angle around the central axis of the electron beam irradiated to the samples from a plane which contains an axis of inclination of the sample and the central axis of the electron beam.

Furthermore, when the sample is inclined at the angle more than 10°, the two detectors are disposed at the position which are turned at the same angle from 5° to 30° around the central axis of the electron beam from the plane in order to detect the symmetrical secondary electron signal with a high efficiency of detection.

DETAILED DESCRIPTION OF THE PREFERRED EMBODIMENTS

Figure 1:
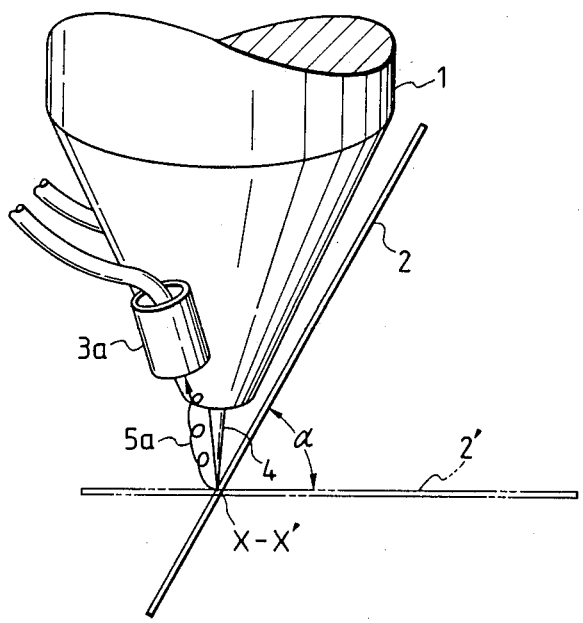
FIG. 1 shows a side view of one embodiment of an electron microscope having two secondary electron detectors in the present invention.
Figure 2:
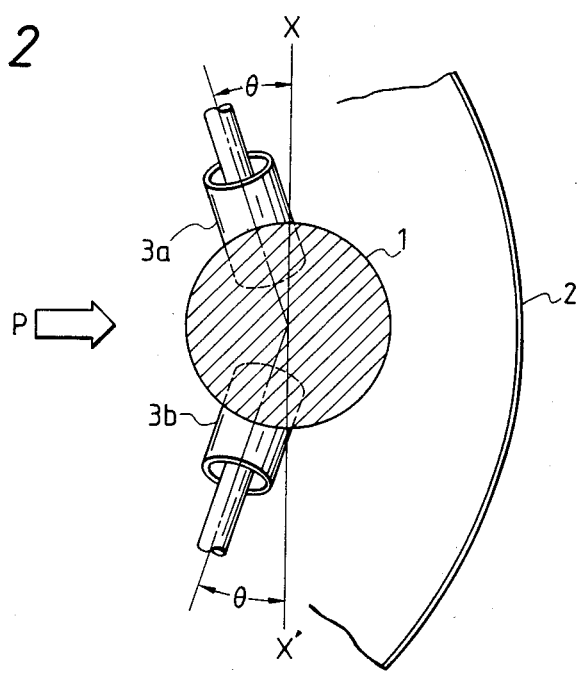
FIG. 2 shows a plane view of the embodiment shown in FIG. 1.
Figure 3:
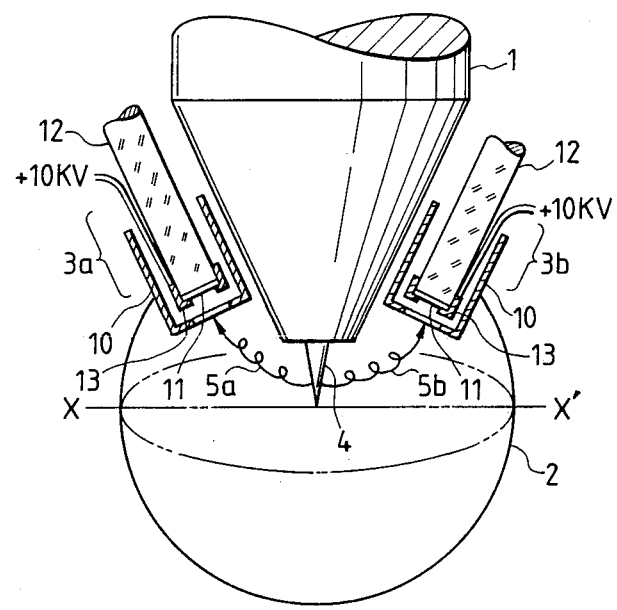
FIG. 3 shows a sectional view of secondary electron detectors viewed from a point P in FIG. 2.

The present invention will be described in detail hearunder by citing an embodiment shown in Figures. In FIGS. 1 and 2, numeral 1 denotes an objective lens. A sample 2 such as a silicon wafer is inclined at an arbitrary large angle $\alpha$ under the objective lens 1, and electron beam 4 is converged so as to scan on the surface of the sample 2. On this occasion, the secondary electrons 5a, 5b are emitted from the sample 2, as shown FIG. 3. FIG. 3 shows a sectional view of the secondary electron detectors viewed from a point P in FIG. 2. In FIG. 3, 10 denotes an earth electrode, 11 a scintillator, 12 a light guide, and 13 a post electrode.

On the surface of the sample 2 and various minute patterns are formed in semiconductor processes, and the electron beam 4 is accelerate by a law acceleration voltage such as 1 to 1.5 KV so as to observe the patterns on the sample directly without evaporating them.

The secondary electrons 5a and 5b emitted from the sample 2 are detected by secondary electron detectors 3a and 3b, and said secondary electron detectors 3a and 3b are disposed symmetrically at the positions which are respectively turned at the same rotational angle $\theta$ around a central axis of the electron beam 4 from a plane which contains an axis of inclination of the sample and the central axis of the electron beam.

Figure 4:
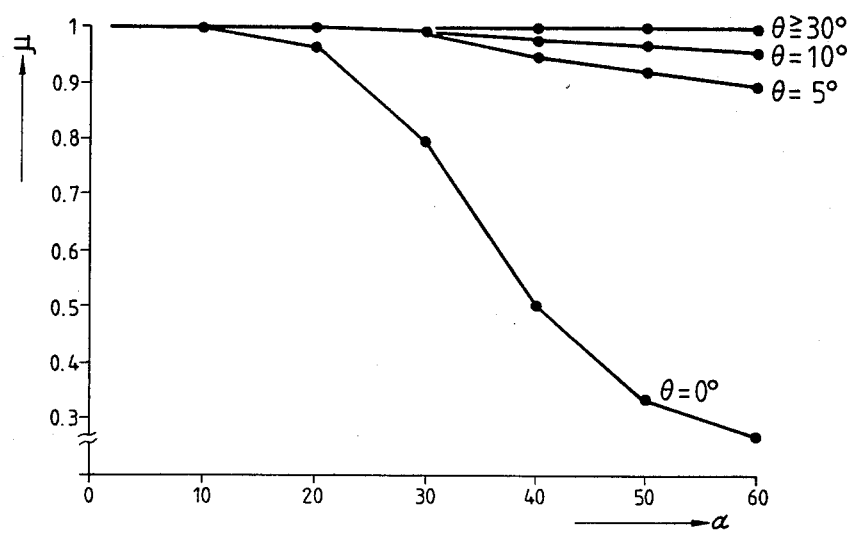
FIG. 4 is a diagram showing the relationship between an angle $\alpha$ of inclination of a sample and an efficiency $\mu$ of detection of secondary electrons obtained when the secondary electron detectors are respectively turned at the same angle $\theta$.

An experiment conducted in such a disposition as described above with the angle $\theta$ varied showed that the range of the angle $\theta$ was 5° to 30°. FIG. 4 is a diagram showing the relationship between an arbitrary angle $\alpha$ of inclination of the sample and an efficiency $\mu$ of detection of secondary electrons obtained when the rotational angle $\theta$ of the secondary electron detector is varied. It is seen from the result of this experiment that such an excellent efficiency of detection of secondary electrons as 90% or above can be obtained even when the sample 2 is inclined from a horizontal state to 60° around the axis of inclination, on condition that $\theta$ is 5° or above. When the value of the angle $\theta$ is increased, on the other hand, the right-to-left symmetry of a wave-form of the electron beam signal from the detectors 3a, 3b is varied.

Figure 5:
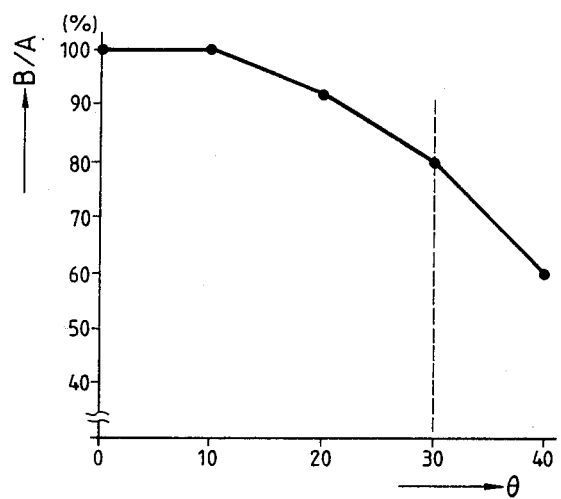
FIG. 5 is a diagram showing the relationship between the ratio B/A which means a symmetrical factor of the wave-form of the secondary electron signal and the angle $\theta$.

FIG. 5 is a diagram showing the relationship between the rotational angle $\theta$ and a ratio B/A of signals generated in the right and the left edge part of the wave-form of the secondary electron signal obtained when an electron beam is made to scan in the direction 7 which is perpendicular to a resist pattern 6 on the surface of the sample such as the silicon wafer.

Figure 6:
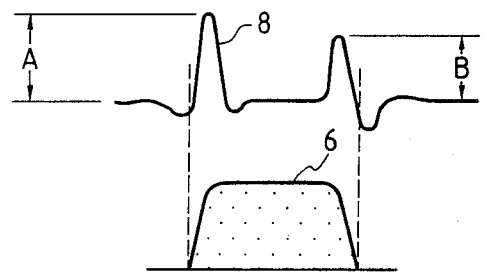
FIG. 6 is a schematic diagram of wave-form when the electron beam scanned the photoresist pattern 6 on the sample.
Figure 7:
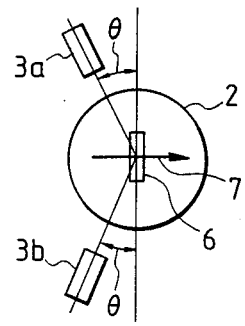
FIG. 7 is a schematic diagram showing the positional positional relation of detectors 3a, 3b, scanning direction 7 and photoresist 6.

FIG. 6 is a diagram showing the wave-form 8 is denoted by A and a signal intensity on the right side of the wave-form 8 is denoted by B. Excellent symmetry of the wave-form of the secondary electron signals is requisite for measuring the length of the pattern with high accuracy, and B/A of 80% or above is requisite experimentally. In view of this, the rotational angle $\theta$ of the secondary electron detectors 3a and 3b are limited to be within 30°.

Therefore, experiment for the angle $\alpha$ of inclination of the sample 2 ranging 0° to 60° showed that an excellent efficiency of detection of the secondary electrons is obtained with an excellent symmetry of the wave-form of the secondary electron signal from the detectors 3a and 3b when the rotational angle $\theta$ was in the range from 5° to 30°.

Patterns formed on a silicon wafer are generally consists of resist patterns intersecting each other perpendicularly, and both of the efficiency of detection and the symmetry of the wave-form are important for the detection of the intersecting patterns and can be met by the present embodiment.

According to the present invention, as described above, secondary electrons are detected without any reduction in the efficiency of detection and with excellent symmetry of the wave-form of the secondary electron signal so as to observe the minute pattern with high accuracy while observing the minute pattern on the sample which are inclined with an arbitrary angle.

What is claimed:

1. A scanning electron microscope for observing and measuring a minute pattern of a sample comprising,
    an electron lens for focusing an electron beam from an electron source onto the sample, wherein the electron beam scans on the sample,
    an inclining means for inclining the sample at an arbitrary angle $\alpha$, and
    two secondary electron detectors are disposed at the positions which are respectively turned at the same angle $\theta$ around a central axis of the electron beam from a plane which contains an axis of inclination of the sample and the central axis of the electron beam.

2. A scanning electron microscope for observing and measuring a minute pattern of a sample as defined in claim 1 further characterized by
    said two detectors are disposed at the position which are turned at the same angle between 5° and 30° around the central axis of the electron beam from the plane when the sample is inclined.

3. A scanning electron microscope for observing and measuring a minute pattern of a sample as defined in claim 2 further characterized by
    said sample is inclined at the angle between 0° and 60°.

4. A scanning electron microscope for observing and measuring a minute pattern of a sample as defined in claim 1 further characterized by
    said electron beam is perpendicularly irradiated to the axis of inclination of the sample.

5. A scanning electron microscope for observing and measuring a minute pattern of a sample as defined in claim 1 further characterized by
    said detectors are symmetrically disposed at the position of right and left of the electron beam.

* * * * *